(12) United States Patent
Maehata

(10) Patent No.: US 7,603,607 B2
(45) Date of Patent: Oct. 13, 2009

(54) DECODING UNIT AND PREPROCESSING UNIT IMPLEMENTED ACCORDING TO LOW DENSITY PARITY CHECK CODE SYSTEM

(75) Inventor: Takashi Maehata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 447 days.

(21) Appl. No.: 11/080,408

(22) Filed: Mar. 16, 2005

(65) Prior Publication Data

US 2005/0210366 A1    Sep. 22, 2005

(30) Foreign Application Priority Data

Mar. 22, 2004   (JP)   ............... 2004-082768

(51) Int. Cl.
    *H03M 13/00*    (2006.01)
(52) U.S. Cl. ...................... 714/752; 714/755
(58) Field of Classification Search .......... 714/752, 714/755
    See application file for complete search history.

(56) References Cited

U.S. PATENT DOCUMENTS

| | | | |
|---|---|---|---|
| 6,421,804 B1 * | 7/2002 | Lee | 714/755 |
| 7,039,846 B2 * | 5/2006 | Hewitt et al. | 714/755 |
| 7,219,288 B2 * | 5/2007 | Dielissen et al. | 714/752 |
| 2006/0156167 A1 | 7/2006 | Dielissen et al. | |

FOREIGN PATENT DOCUMENTS

| | | |
|---|---|---|
| JP | 2004-186940 | 7/2004 |
| JP | 2006-508577 | 3/2006 |
| WO | WO 2004-049578 A1 | 6/2004 |

OTHER PUBLICATIONS

Sae-Young Chung et al., "On the Design of Low-Density Parity-Check Codes within 0.0045 dB of the Shannon Limit", IEEE Communications Letters, vol. 5, No. 2, Feb. 2001, pp. 58-60.
Engling Yeo et al., "VLSI Architectures for Iterative Decoders in Magnetic Recording Channels", IEEE Transactions on Magnetic, vol. 37, No. 2, Mar. 2001, pp. 748-755.
Tadashi Wadayama, "Introduction to Low Density Parity Check Codes and the Sum-Products Algorithm", Technical Report of IEICE., MR 2001-83, Dec. 2001, The Institute of Electronics, Information and Communication Engineers.

* cited by examiner

*Primary Examiner*—Guy J Lamarre
*Assistant Examiner*—Sam Rizk
(74) *Attorney, Agent, or Firm*—McDermott Will & Emery LLP

(57) ABSTRACT

In processing of calculating outer value log-ratio αmn by a row processing unit performing an operation on rows of a parity check matrix, a minimum absolute value and a second minimum absolute value out of data utilized for the row processing are stored. When the data to be processed matches with the minimum value, the second minimum value is outputted. When the data to be processed does not match with the minimum value, the minimum value is output. Thus, it is possible to simplify a construction of a portion for executing Min operation of obtaining a minimum value in the processing of a decoding operation according to a min-sum decoding algorithm. It is possible to reduce a scale of circuitry for decoding low density parity check codes.

7 Claims, 9 Drawing Sheets

| TRANSMISSION DATA | MODULATOR OUTPUT | INTENSITY MODULATION | RECEPTION LEVEL | | DEMODULATOR OUTPUT |
|---|---|---|---|---|---|
| 0 | 1 | STRONG LIGHT | 7: | VERY STRONG LIGHT | 3 |
| | | | 6: | FAIRLY STRONG LIGHT | 2 |
| | | | 5: | STRONG LIGHT | 1 |
| | | | 4: | NORMAL LIGHT | 0 |
| 1 | −1 | WEAK LIGHT | 3: | SLIGHTLY WEAKER LIGHT THAN NORMAL | −1 |
| | | | 2: | WEAK LIGHT | −2 |
| | | | 1: | FAIRLY WEAK LIGHT | −3 |
| | | | 0: | VERY WEAK LIGHT | −4 |

$\alpha 11 = \text{sign}(\lambda 2 + \beta 12) * \text{sign}(\lambda 3 + \beta 13) * \text{Min}(|\lambda 2 + \beta 12|, |\lambda 3 + \beta 13|)$ $\alpha 12 = \text{sign}(\lambda 1 + \beta 11) * \text{sign}(\lambda 3 + \beta 13) * \text{Min}(|\lambda 1 + \beta 11|, |\lambda 3 + \beta 13|)$ $\alpha 13 = \text{sign}(\lambda 1 + \beta 11) * \text{sign}(\lambda 2 + \beta 12) * \text{Min}(|\lambda 1 + \beta 11|, |\lambda 2 + \beta 12|)$

1ST COLUMN

DECODING UNIT AND PREPROCESSING UNIT IMPLEMENTED ACCORDING TO LOW DENSITY PARITY CHECK CODE SYSTEM

BACKGROUND OF THE INVENTION

1. Field of the Invention

The present invention relates to a decoding unit for decoding input codes as well as circuitry for performing preprocessing for a predetermined processing in the decoding processing. More particularly, the invention relates to a construction of a circuit unit for decoding Low Density Parity Check (LDPC) codes.

2. Description of the Background Art

For constructing a data communication system, such performances are required as fast communication, low power consumption, and high communication quality (low bit error rate). An error correction technique for detecting and correcting errors in received codes has been widely utilized, as one of techniques satisfying the above requirements, in wireless, cable and record systems and others.

In recent years, attention has been given to LDPC (Low Density Parity Check) codes and sum-product algorithm as such error correction technique. The decoding operation utilizing the LPDC codes is discussed the article by S. Y. Chung et al., "On the Design of Low-Density Parity-Check Codes within 0.0045 dB of the Shannon Limit," IEEE COMMUNICATIONS LETTERS, Vol. 5, No. 2, February 2001, pp. 58-60. The Chung reference discloses that decoding characteristics of 0.04 dB to the Shannon limit of the white Gaussian communication channel can be achieved by utilizing a rate—½ irregular LDPC codes. The irregular LDPC codes are such codes that a row weight (number of "1" set in a row) and a column weight (number of "1" set in a column) in a parity check matrix are not constant. The LDPC codes, for which the row weight and the column weight are constant in each row and each column, are referred to as regular LDPC codes.

Chun discloses a mathematical algorithm for decoding the LDPC codes according to the sum-product algorithm, but fails to show a hardware implementation for specifically performing a huge amounts of calculations involved.

An article by Yeo et al., "VLSI Architectures for Iterative Decoders in Magnetic Recording Channels," IEEE Trans. Magnetics, Vol. 37, No. 2, March 2001, pp. 748-755 discusses a circuit construction of a decoding unit of LDPC codes. According to the Yeo reference, a posteriori probability of information symbol based on reception series is calculated according to MAP (maximum a posteriori probability) algorithm based on trellis, i.e., BCJR algorithm. In the trellis, forward iteration and backward iteration are calculated for each state, and the a posteriori probability is obtained based on the forward and backward iteration values. In this calculation equations, Add-Compare-Select-Add units are used for the calculations. In calculation of LDPC codes, the units are configured such that a parity check matrix is generated according to the sum-product algorithm, and an estimated value is calculated by utilizing values received from different check nodes.

Wadayama discusses in the article, "Low Density Parity Check Codes and the Sum-Product Algorithm," Technical Report of IEICE, MR 2001-83, December 2001, the LDPC codes and the sum-product algorithm as well as min-sum algorithm in a log-domain. In Wadayama, it is disclosed that processing according to an f-function of Gallager can be implemented only with four kinds of fundamental operations, or addition, minimization, positive/negative determination, and multiplication of positive and negative signs.

According to Yeo and Wadayama, for generating a parity check matrix to calculate a first order estimated word, an outer value log-ratio α (log-ratio of outer information) is updated with the f-function of Gallager according to sum-product algorithm, and then a priori value log-ratio β (log-ratio of a priori information) of symbol is calculated based on the outer value log-ratio. Therefore, the operation of the Gallager function requires a long time and an increased unit scale.

Wadayama suggests that the sum-product decoding algorithm is equivalent to the min-sum decoding algorithm, and use of the min-sum decoding algorithm can simplify practical circuit construction. Even with the min-sum decoding algorithm, however, in the Min operation of calculating a minimum value by using a parity check matrix, the minimum value is obtained by performing the Min operation for each element. Therefore, elements of arithmetic operation targets increase in number with increase in code length, so that a processing time is likewise increased and the scale and complexity of the decoding unit are increased.

SUMMARY OF THE INVENTION

An object of the invention is to provide a decoding unit that decode received codes with a reduced complexity in construction.

Another object of the invention is to provide a decoding unit that can implement a min-sum processing step in decoding processing of LDPC codes with a reduced complexity in construction.

A decoding unit according to a first aspect of the invention includes a likelihood storing section for extracting a first signal of the lowest likelihood and a second signal of the second lowest in likelihood next to the first signal in the signals in a unit block formed of a predetermined number of signals, and storing the first and second signals; a selecting section for selecting one of the first and second signals such that a signal of the lowest likelihood other than the signal of interest is selected in the associated unit block; and a received signal estimating section for producing a new signal from the signal selected by the selecting section and a sign of the signals in the one unit block to generate an estimated signal series of the signals in the one unit block.

A preprocessing unit according to a second aspect of the invention is for performing a preprocessing for processing of calculating an estimated value of an input signal by using elements aligned in a first direction in a parity check matrix, and includes a storing section accepting signals included in one processing unit among the input signals, and extracting two signals smaller in absolute values in the unit and storing the extracted signals; and a minimum value detecting section for selecting one of the two signals stored in the storing section such that the signal smallest in the one processing unit other than the signal of interest is select and outputting the selected one for the signals in the one processing unit. Processing based on elements aligned in the first direction in the parity check matrix is performed on the signals in the one processing unit according to the output value of the minimum value detecting section.

According to the decoding unit of the first aspect, it is only required to store the two signal values of low likelihood, and it is not required to store all the signal values in the processing unit block. Therefore, the circuit scale can be reduced. In addition, the two signals are selected merely as candidates, and it is not necessary to perform the selecting processing with all the other signals in the one processing unit block being the selection target, resulting in a reduced amount of calculations and therefore, a reduced processing time.

According to the preprocessing unit of the second aspect, the two signals even smaller in absolute value are extracted from the input signals included in the one processing unit, and are stored. For the signals in this one processing unit, on of the signals stored in the storing section is selected such that the signal of the smallest absolute value is selected from the signals except the signal of interest. In the processing of detecting the minimum value, it is not necessary to store all the signals for making all the other signals the selection candidates to perform the minimum value detecting processing. Thus, the circuit scale and the processing time can be reduced. Accordingly, it is possible to perform, at high speed, the preprocessing for calculation of an outer value log-ratio, or for minimum value detection in a decoding operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figures 1, 2:
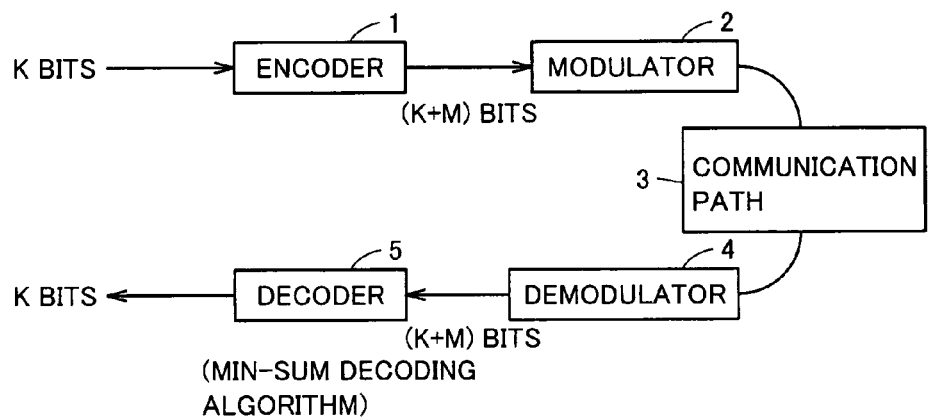
FIG. 1 schematically shows a construction of a communication system employing the invention.
FIG. 2 shows an example of a relationship between transmission data and demodulated data.

FIG. 1 shows an example of a construction of a communication system using a decoding unit according to the invention. In FIG. 1, the communication system includes, on a transmission side, an encoder 1 for producing transmission codes by adding redundancy bits for error correction to transmission information, and a modulator 2 for modulating a code of (K+M) bits received from encoder 1 in accordance with a predetermined method, and supplying the modulated codes to a communication path 3.

Encoder 1 adds redundancy bits of M bits for parity calculation to information of K bits, to produce an LDPC code (Low Density Parity Check code) of (K+M) bits. In a parity check matrix, a row corresponds to the redundancy bits, and a column corresponds to the code bits.

Modulator 2 performs modulation such as amplitude modulation, phase modulation, code modulation, frequency modulation or orthogonal frequency division multiplex modulation depending on the architecture of communication path 3. When communication path 3 is an optical fiber, for example, modulator 2 changes an output intensity of a laser diode according to the transmission information bit value, and thereby performs light intensity modulation (i.e., a kind of amplitude modulation). For example, when the transmission data bit is "0", the emission intensity of the laser diode is increased to be set to "+1" for transmission. When the transmission data bit is "1", the emission intensity of the laser diode is reduced to convert and transmit it as "−1".

A receiving side includes a demodulator 4 for demodulating the modulated signal transmitted via communication path 3 to produce a demodulated digital code of (K+M) bits, and a decoder 5 for applying a parity check matrix operation processing on the code of (K+M) bits to reproduce the original information of K bits.

Demodulator 4 performs demodulation processing depending on the transmission mode on communication path 3. For the case of amplitude modulation, phase modulation, code modulation, frequency modulation or orthogonal frequency division multiplex modulation, demodulator 4 performs a processing such as amplitude demodulation, phase demodulation, code demodulation, or frequency demodulation, correspondingly.

FIG. 2 shows, in a list form, a correspondence relationship between output data of modulator 2 and demodulator 4 in the case when communication path 3 is an optical fiber. Referring to FIG. 2, in the case where communication path 3 is the optical fiber, when the transmission data is "0", modulator 2 increases the emission intensity of the transmitting laser diode (light-emitting diode) to transmit "1", and when the transmission data bit is "1", the emission intensity is reduced to transmit a bit of "−1".

Due to transmission loss or the like on communication path 3, the intensity of the light arrived to demodulator 4 distributes in an analog fashion over a range from the largest intensity to the smallest intensity. Demodulator 4 performs quantization processing (analog-to-digital conversion) on the received optical signal, and detects the reception level. FIG. 2 shows a received signal intensity in the case where the reception light level is quantized in eight levels. When the reception light level is data "7", the emission intensity is significantly high, and when the reception level is "0", the light intensity is significantly low. Each reception light level is associated with a signed data, and is output from demodulator 4. When the reception light level is "7", demodulator 4 outputs data "3". When the reception light level is "0", demodulator 4 outputs data "−4". Accordingly, demodulator 4 outputs a multi-level quantized signal for a received signal of one bit.

Decoder 5 accepts the reception information of (K+M) bits (each bit including multi-level information) from demodulator 4, and applies the LDPC parity check matrix according to the min-sum decoding algorithm to restore the original information of K bits.

In FIG. 2, demodulator 4 produces a bit quantized in eight levels. In general, however, demodulator 4 can perform the decoding processing with a bit quantized into an L value (L≧2).

In FIG. 2, a comparator may be used to determine the level of a reception signal according a threshold value, to produce a binary signal.

Figure 3:
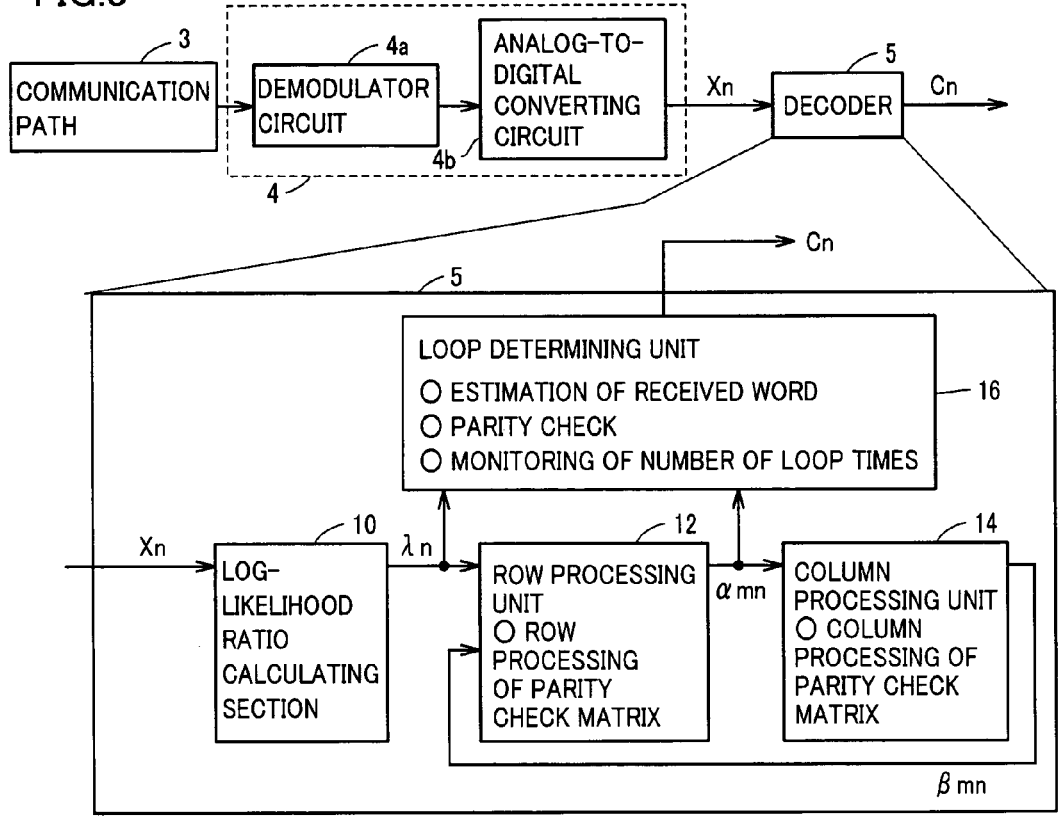
FIG. 3 schematically shows a construction of a decoder according to a first embodiment of the invention.

FIG. 3 schematically shows a construction of decoder 5 according to the invention. FIG. 3 also shows demodulator 4 and communication path 3. Demodulator 4 includes a demodulating circuit 4a for demodulating a signal applied from communication path 3, and an analog-to-digital converting circuit 4b for converting an analog demodulated signal produced by demodulating circuit 4a into a digital signal. Analog-to-digital converting circuit 4b supplies an output data Xn to decoder 5. Data Xn supplied to decoder 5 is L-level data with L being equal to or greater than 2. Since data Xn is multi-level quantized data, data Xn will be referred to as a "symbol" hereinafter. Decoder 5 decodes the input symbol Xn series according to the min-sum decoding algorithm, to produce an estimated code Cn.

Decoder 5 includes a log-likelihood ratio calculating section 10 for producing a log-likelihood ratio λn of demodulated symbol Xn received from demodulator 4, a row processing section 12 for performing a row processing of the parity check matrix, a column processing section 14 for performing a column processing of the parity check matrix, and a loop determining section 16 for producing a sign according to a log-likelihood ratio λn received from log-likelihood ratio calculating section 10 and output bits (outer value log-ratio) αmn of the row processing section 12.

Log-likelihood ratio calculating section 10 produces log-likelihood ratio λn independently of noise information of the reception signal. When the noise information is taken into consideration, log-likelihood ratio λn is usually given by Xn/2·σ, where σ represents a variance of noises. In the first embodiment, however, log-likelihood ratio calculating section 10 is formed of a buffer circuit or a multiplying-constant circuit, and log-likelihood ratio λn is given by Xn·f, where f is a non-zero, positive number. By calculating the log-likelihood ratio without utilizing the noise information, the circuit construction as well as the calculation processing can be simplified. According to the min-sum decoding algorithm, the operation is performed utilizing a minimum value in the parity check matrix processing, and therefore linearity is maintained in signal processing. Thus, there is no need for a processing such as normalization of the output data according to the noise information.

Row and column processing sections 12 and 14 perform the operational processing according to the following equations (1) and (2), and execute the processing (row processing and column processing) on each element of the row and each element of the column in the parity check matrix, respectively. Row processing section 12 updates outer value log-ratio αmn according to a priori value log-ratio βmn and log-likelihood ratio λn supplied from column processing section 14.

$$\alpha_{mn} = \left( \prod_{n' \in A(m)\backslash n} \text{sign}(\lambda_{n'} + \beta_{mn'}) \times \min_{n' \in A(m)\backslash n} |\lambda_{n'} + \beta_{mn'}| \right) \quad (1)$$

$$\beta mn: \text{ initial value} = 0$$

$$\beta_{mn} = \sum_{m' \in B(n)\backslash m} \alpha_{m'n} \quad (2)$$

In the above equations (1) and (2), (n'∈A(m)\n) and (m'∈B(n)\m) represent elements other than the element of interest. In outer value log-ratio αmn, n' is not equal to n(n'≠n). In a priori value log-ratio β, m' is not equal to m (m'≠m). Suffixes "mn" representing positions of α and β in the matrix are usually expressed in a subscript form, but are represented in a planar form in the preset specification for the sake of readability.

The function "sign(x)" is defined by the following equation (3).

$$\text{sign}(x) = \begin{cases} 1 & x \geq o \\ -1 & x < 0 \end{cases} \quad (3)$$

The function "min" represents an operation for obtaining a minimum value.

Sets A(m) and B(m) are subsets of a set [1, N]={1, 2, ..., N} in the case where two-element, M by N matrix H=[Hmn] is the parity check matrix for LDPC codes to be decoded.

A(m)={n: Hmn=1}     (4)

B(n)={m: Hmn=1}     (5)

Thus, subset A(m) means a set of column indices carrying "1" in the m-th row of parity check matrix H, and subset B(n) represents a set of row indices carrying "1" in the n-th column of parity check matrix H.

Figure 4:
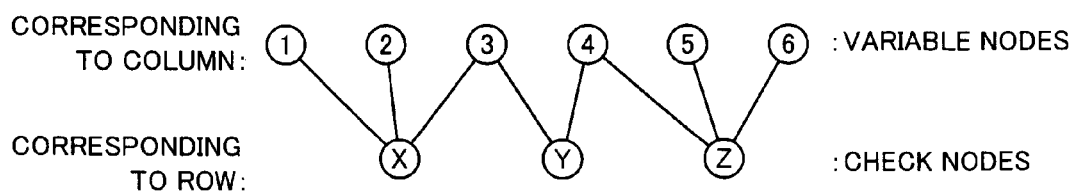
FIG. 4 shows a matrix used for defining a subset used in the decoding algorithm according to the invention.

Specifically, a parity check matrix H as shown in FIG. 4 will now be considered. In parity check matrix H shown in FIG. 4, "1" is present at first, second and third columns in the first row, and "1" is also present at the third and fourth columns in the second row. Further, "1" is present at the fourth, fifth and sixth columns in the third row. In this case, therefore, subset A(m) is expressed as follows:

A(1)={1, 2, 3},

B(2)={3, 4},

A(3)={4, 5, 6}

Likewise, subset B(n) is expressed as follows:

B(1)=B(2)={1},

B(3)={1, 2},

B(4)={2, 3},

B(5)=B(6)={3}

Figure 5:
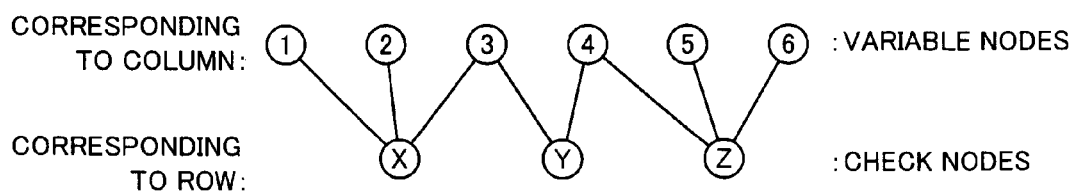
FIG. 5 illustrates a Tanner graph of a parity check matrix shown in FIG. 4.

For the parity check matrix H, when a Tanner graph is applied, "1s" represent a connection relationship between variable nodes corresponding to the columns and check nodes corresponding to the rows. This relationship is referred to as "carrying "1"" in the present specification. More specifically, as shown in FIG. 5, variable nodes 1, 2 and 3 are connected to a check node X (first row), and variable nodes 3 and 4 are connected to a check node Y (second row). Variable nodes 4, 5 and 6 are connected to a check node Z (third row). The variable node corresponds to the column in parity check matrix H, and check nodes X, Y and Z correspond to the respective rows in parity check matrix H. Accordingly, the parity check matrix as shown in FIG. 4 is applied to a code of 6 bits in total of 3 information bits and 3 redundancy bits.

The parity check matrix H includes only a small number of "1s", and thus is a low density matrix, so that an amount of calculations can be made small.

Each conditional probability P(Xi|Yi) is propagated between the variable nodes and check nodes, and a likely sign is determined for each variable node according to the MAP algorithm. Conditional probability P(Xi|Yi) represents the possibility that Xi holds under the condition of Yi.

Loop determining section 16 produces first order estimated words based on results of operational processing by row and column processing sections 12 and 14, and determines whether these first order estimated words form code words. When the syndrome does not assume "0" in the parity checking, the processing will be iterated to be executed. When the processing is iterated a predetermined number of times, the first order estimated word currently produced is output as the code word.

According to the present invention, rather than the procedure that the operational processing manipulation (referred to as "Min operation" hereinafter) of minimum value function, min, in the foregoing equation (1) is performed without utilizing log-likelihood ratio λn and a priori value log-ratio β of all the input data (symbols) Xn, the operation of minimum value function, min, is executed by storing the minimum value and the second minimum value of |λn+βmn| in the code series, and selecting either of the two minimum values.

An operation of calculating an outer value log-ratio αmn in row processing section 12 will now be described specifically. The following input symbols are considered for the series of input symbols Xn.

$$Xn=(3, 1, 2, -1, 1, 2)$$

Check matrix H as shown in FIG. 4 is used for the parity check matrix H, which is merely referred to as the "check matrix H" hereinafter.

Figure 6A:
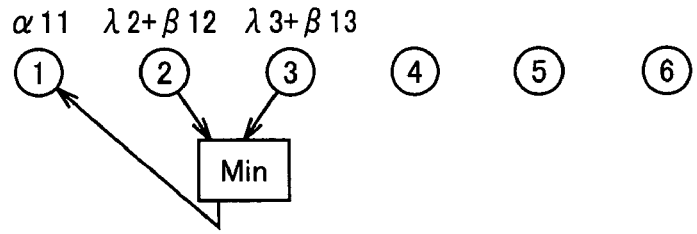
FIGS. 6A-6C illustrate operation contents of a row processing section shown in FIG. 3.

The processing on check nodes X shown in FIG. 5 is executed as the processing of the first row in check matrix H. In this case, as shown in FIG. 6A, outer value log-ratio αmn can be obtained by detecting the minimum value of the absolute values by using values (λ2+β12) and (λ3+β13) of variable nodes 2 and 3, and multiplying the signs of these values of variable nodes 2 and 3. Therefore, outer value log-ratio α11 is expressed by the following equation:

$$\alpha 11 = \text{sign}(\lambda 2+\beta 12) \cdot \text{sign}(\lambda 3+\beta 13) \cdot \text{Min}(|\lambda 2+\beta 12|, |\lambda 3+\beta 13|).$$

Elements in check matrix H corresponding to variable nodes 4 to 6 are "0", and are not utilized in this computational processing. The character "·" in the above equation represents multiplication.

Figure 6B:
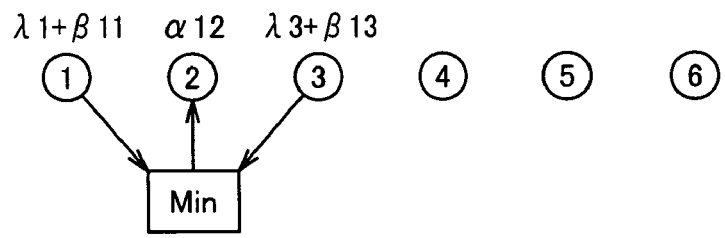

As shown in FIG. 6B, outer value log-ratio α12 can likewise be obtained according to the following equation, using values of (λ1+β11) and (λ3+β13) of variable nodes 1 and 3.

$$\alpha 12 = \text{sign}(\lambda 1+\beta 11) \cdot \text{sign}(\lambda 3+\beta 13) \cdot \text{Min}(|\lambda 1+\beta 11|, |\lambda 3+\beta 13|).$$

Figure 6C:
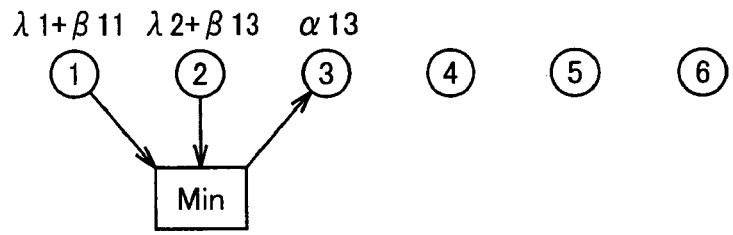

As shown in FIG. 6C, outer value log-ratio αmn 13 can be calculated according to the following equation, using values of (λ1+β11) and (λ2+β12) of variable nodes 1 and 2:

$$\alpha 13 = \text{sign}(\lambda 1+\beta 11) \cdot \text{sign}(\lambda 2+\beta 12) \cdot \text{Min}(|\lambda 1+\beta 11|, |\lambda 2+\beta 12|).$$

As described above, in the computational operation for the first row, as shown in FIGS. 6A-6C, the component of the element of the smallest absolute value other than the element of interest or the self in the first row is calculated, and the signs of the associated components are multiplied.

Among the symbols involved in a processing unit, the symbol of the smallest absolute value, or the lowest likelihood information (information relating to the reliability in accuracy, and thus corresponding to probability information) is obtained, and the outer value log-ratio is obtained. Thus, when utilizing the parity check matrix, the symbol in the bit position carrying "1" contains information relating to the reliability in communication path. Accordingly, the symbol of the lowest reliability (i.e., lowest likelihood), or the symbol of the smallest absolute value and the highest possibility of being erroneous is detected. Such symbol of the lowest likelihood is regarded as exerting the largest influence, and is utilized to obtain the absolute values. This is the specific contents of processing of the Min operation.

The sign of the outer value log-ratio αmn is estimated by multiplying all the signs for the codes highly being likely to be erroneous and exerting an influence in the signal series in the processing unit. The processing starts from the state of the lowest reliability, and will be iterated to attain the sign value of the highest reliability. This processing operation is the contents of the Min operational processing in the min-sum decoding algorithm.

For example, the modulator shown in FIG. 2 generates the output, which assumes the value of "3" or "-4" when the transmission code bit is "1" or "0". However, when the output value is "0" or "-1" due to the influence by the transmission loss on the communication path, the absolute values thereof are small, and the possibility of error being occurring is high. The original codes is recovered, using such uncertain reception signals of the small absolute values.

In the following description, a signal of the smallest absolute value is referred to as a signal of the lowest likelihood because such signal has a high probability of occurrence of errors.

Figure 7:
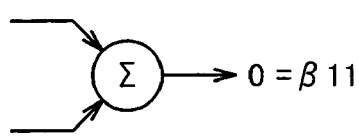
FIG. 7 illustrates a processing operation of a column processing section shown in FIG. 3.

Outer value log-ratio αmn obtained is supplied to column processing section 14 and loop determining section 16 shown in FIG. 3. Column processing section 14 performs the computational processing represented by the foregoing equation (2). In this processing, the outer value log-ratio produced in each row of check matrix H is used, and the outer value log-ratios in the positions carrying "1," of the corresponding column other than the row of interest are added. Therefore, when parity check matrix H has a structure shown in FIG. 4, a priori value log-ratio β11 becomes "0" because "1" is not present in any position on the first column other than the first row or of the row of interest as shown in FIG. 7.

Loop determining section 16 uses outer value log-ratio αmn produced by row processing section 12 and log-likelihood ratio λn supplied from log-likelihood ratio calculating section 10, and produces a code word formed of a plurality of codes. The number of codes corresponds to the number of columns in the check matrix.

Figure 8:
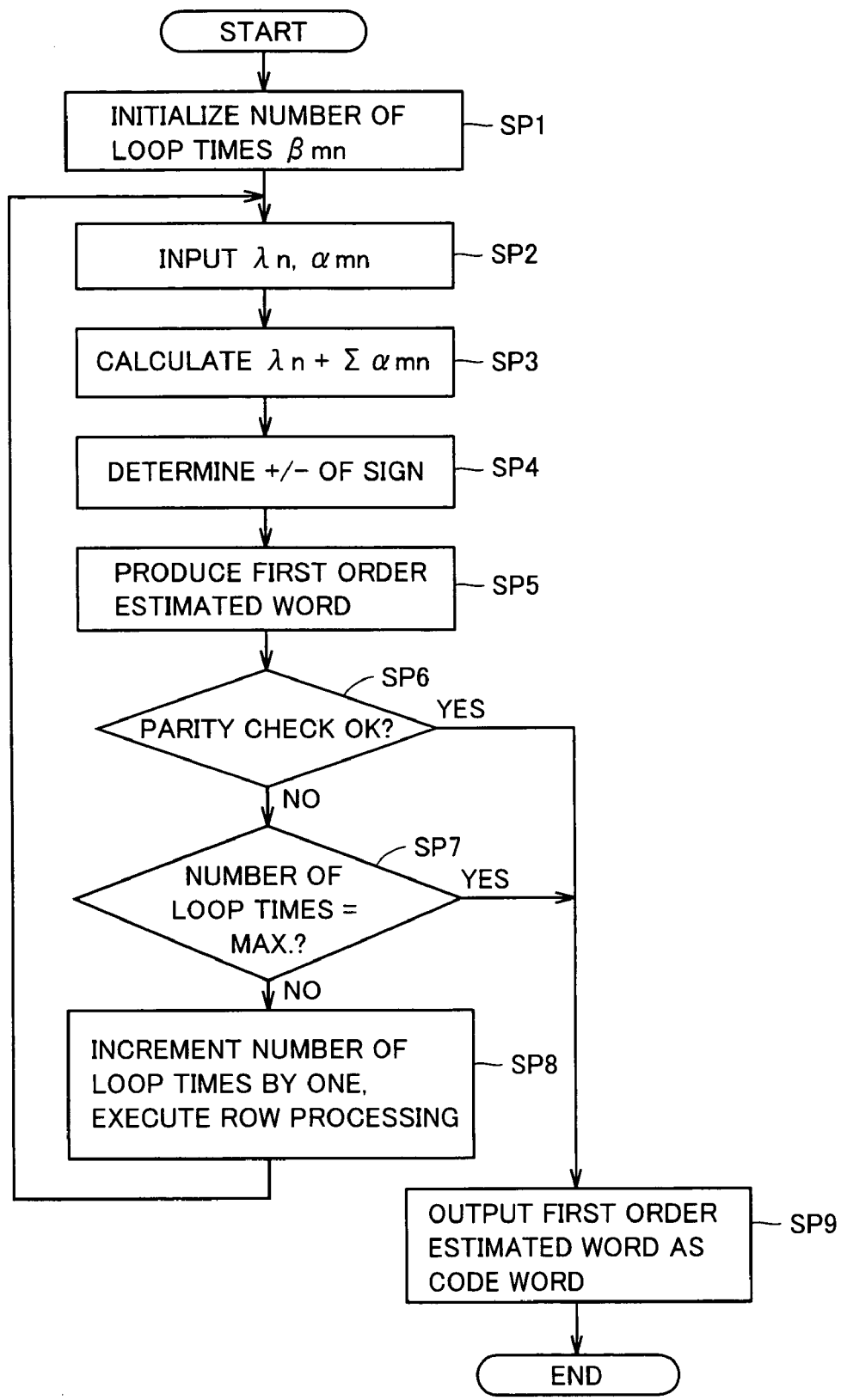
FIG. 8 is a flowchart representing an operation of a loop determining section shown in FIG. 3.

FIG. 8 is a flowchart representing a processing operation of loop determining section 16. Referring to FIG. 8, the processing operation of loop determining section 16 will now be described.

In an initial operation, the number of times of loops as well as a priori value log-ratio βmn are initialized. The number of times of loops represents the number of times of operations in the loop of producing outer value log-ratio $\alpha mn$ by row processing section 12 with a priori value log-ratio $\beta mn$ produced by column processing section 14. A maximum value is predetermined for the number of times of loops. A priori value log-ratio $\beta mn$ is initialized to "0" (step SP1).

Then, according to the received symbol series, the log-likelihood ratio calculating section and the row processing section produce log-likelihood ratio $\lambda n$ and outer value log-ratio $\alpha mn$, respectively, and supply them to loop determining section 16 (step SP2).

According to log-likelihood ratio $\lambda n$ and outer value log-ratio $\alpha mn$, loop determining section 16 performs the operation of $(\lambda n + \Sigma \alpha mn$ to calculate an estimated reception word Qn (step SP3). The summation $\Sigma$ is effected on elements m in a subset B(n).

A positive or negative sign of the value Qn calculated in step SP3 is determined (step SP4), and a first order estimated code Cn is produced (step SP5). The determination of the positive/negative of the sign can be made by observing the bit value of the most significant bit (sign bit) when the estimated reception word Qn is represented in a two's-complement notation.

When all estimated codes Cn are produced, and the code word (C1, ..., CN) is produced, then the parity check is executed (step SP6). In this parity check, ((C1, ..., CN)·H$^t$=0) is calculated by using a transposed matrix of the check matrix H. When the syndrome produced through the calculation is zero, the first order estimated word (C1, ..., CN) is output as the estimated word (step SP9).

When the syndrome produced is no-zero, then it is determined whether the number of times of loops is the maximum value (step SP7). Specifically, the number of times of production of the first order estimated word is counted. When the count reaches the predetermined maximum value, further calculation for the code is stopped, and the first order estimated word, which is currently produced, is output as the code word (step SP9). Thereby, such a situation is prevented that an operational processing time is unnecessarily wasted for a noisy code of poor convergency.

When it is determined in step SP7 that the number of times of loops does not reach the maximum value, the number of times of loops is incremented by one, and the processing by row and column processing sections 12 and 14 is resumed to execute the operational processing starting at step SP2 again.

The above series of processing is the processing in the LDPC min-sum decoding algorithm. A sparse matrix or a matrix containing a less number of "1s" is utilized for the parity check matrix H, whereby the number of times of calculations is reduced. In the Min operation, however, it is necessary to utilize all the values of the nodes carrying "1" for detecting the minimum absolute value. Therefore, if the size of parity check matrix H increases with increase in number of the reception symbols, the number of "1" increases correspondingly, and the circuit scale of the portion performing the Min operation increases. According to the present invention, the Min operation is operated at high speed with circuitry of a small scale in accordance with a procedure described below.

Figure 9:
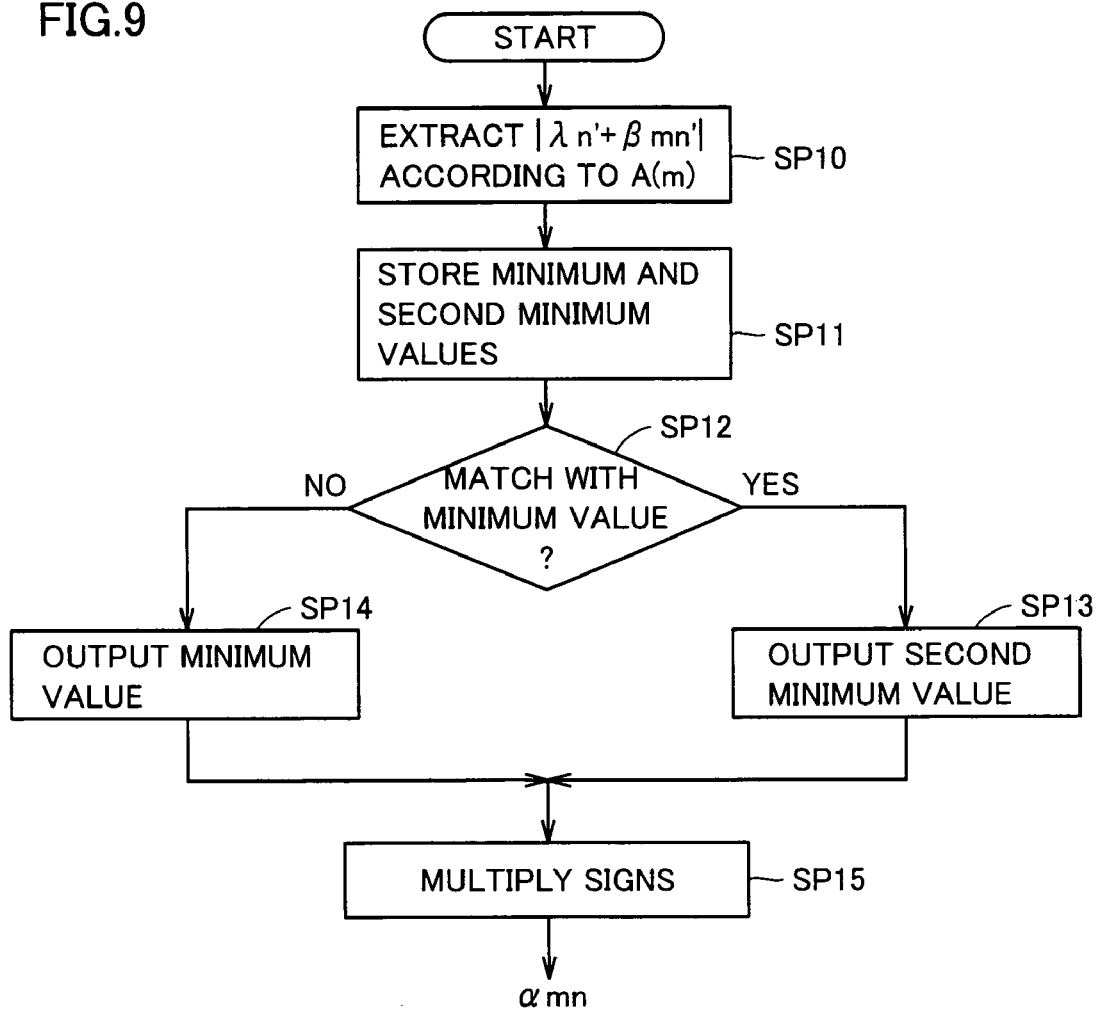
FIG. 9 is a flowchart representing an outer value log-ratio calculating operation of the row processing section according to the first embodiment of the invention.

FIG. 9 is a flowchart representing a processing operation of row processing section 12 according to the first embodiment of the invention. Referring to FIG. 9, the operation of the row processing section according to the first embodiment of the invention will now be described.

According to subset A(m) of check matrix H, a series of $|\lambda n' + \beta mn'|$ is extracted (step SP10).

From the absolute value series extracted, the minimum value and the second minimum value are detected and stored (step SP11). The case that the minimum value and the second minimum value are equal to each other is allowed. Specifically, when calculating outer value log-ratio $\alpha mn$, it is necessary to perform the operation of selecting the minimum absolute value (referred to as the "minimum value" hereinafter) from the set except itself or the value of the node of interest. Therefore, the minimum value and the second minimum value may be equal to each other. Then, the Min operation is performed. It is determined whether the input value of($|\lambda n' + \beta mn'|$) matches with the stored minimum value (step SP12).

When the input value matches with the minimum value, the second minimum value is selected as the corresponding Min operation value (step SP13). When it does not match with the minimum value, the minimum value under comparison is selected and output as the Min operation value (step SP14).

The Min operation value selected in steps SP13 and SP14 is multiplied with the sign to produce outer value log-ratio $\alpha mn$ (step SP15).

Therefore, it is not required to store all the values on the variable nodes (carrying "1" in the check matrix) of the Tanner graph, and it is merely required to store the first and second minimum values so that the circuit scale can be significantly reduced. Since only the comparison with the minimum value is performed to execute the Min operation, the comparison with the other absolute value components is not required. This processing reduces the operational processing time.

In the processing of multiplying the signs in step SP15, only the signs other than that of the value of interest are multiplied, and the sign can be represented by one bit in the case where the value for each node is represented in the two's-complement notation. Therefore, the storing section for storing the signs for the sign multiplication can have a significantly reduced storage capacity. In this case, the multiplied value of the signs of all the variable nodes may be obtained in advance in detecting the minimum value. Thus, the multiplication of the signs can be easily performed based on the value of the product of all the signs and the sign of the self or the value of the node under operation. Specifically, When the product of the signs of all the variable nodes is positive, and the sign of the self is negative, the product of the signs of the operation values other than the self is negative. Therefore, when the sign bit "1" represents the negative in the two's-complement notation, the multiplication processing in the sign operation can be performed by determining match/mismatch between the sign bit for the product of the signs of all the nodes and the sign of the self. Thus, the signal multiplication processing is likewise simplified, and the calculation of outer value log-ratio $\alpha mn$ can be significantly simplified.

Now, the following subset Vm is assumed as an example.

$$Vm = \{v1, v2, v3, \ldots, vk-1, vk\},$$

where $vi = |\lambda i + \beta mi|$

The Min operation will now be considered. It is assumed that the minimum value is v1, and the second minimum value is vk. Now, the Min operation is performed on outer value log-ratio $\alpha m1$. In this case, the minimum value is calculated from among the values v2 to vk other than the self Since the minimum value is value v1 of the self, the second minimum value vk is selected in the Min operation of the value v1, so that the correct result of Min operation is obtained. For value v2, the minimum value is likewise selected from among the values v1 and v3-vk, and thus v1 is selected so that correct result of Min operation is obtained. For value vk, the minimum value is likewise selected from among the values v1-vk−1 other than the self vk, and thus v1 is selected.

Accordingly, the Min operation can be accurately performed by the operations in steps SP12 to SP14 as sown in FIG. 9.

Figure 10:
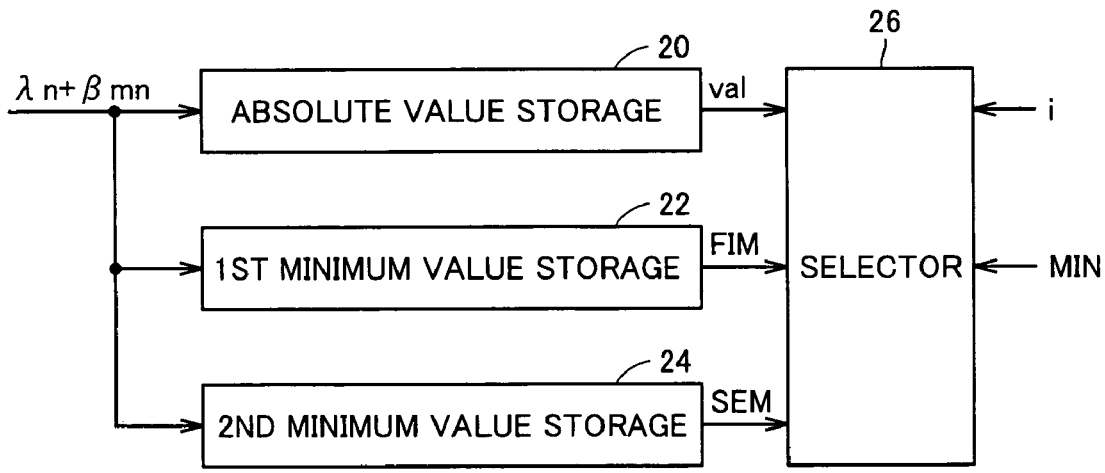
FIG. 10 schematically shows a construction of a Min operation section according to the first embodiment of the invention.

FIG. 10 schematically shows a construction of a portion for performing the Min operation in row processing section 12 shown in FIG. 3. In FIG. 10, the Min operation section includes an absolute value storage 20 for storing the absolute value by using input value ($\lambda n+\beta mn$), a first minimum value storage 22 successively receiving the input values ($\lambda n+\beta mn$) and storing a first minimum value FIM of the smallest absolute value, a second minimum value storage 24 receiving the series of input values ($\lambda n+\beta mn$) and storing a second minimum value SEM, and a selector 26 for reading a corresponding absolute value val in absolute value storage 20 according to positional information i on the position in the input value series, and comparing the absolute value va with first minimum value FIM to select one of first and second minimum values FIM and SEM based on a result of the comparison for outputting a result MIN of the Min operation.

Absolute value storage 20 is successively supplied with elements in a corresponding row (m-th row) of check matrix H, and stores the absolute values thereof. In this case, absolute value storage 20 is successively supplied with only the elements corresponding to the column indices of subset A(m) carrying "1" in check matrix H. Positional information i represents a position of each respective element in subset A(m).

Figure 11:
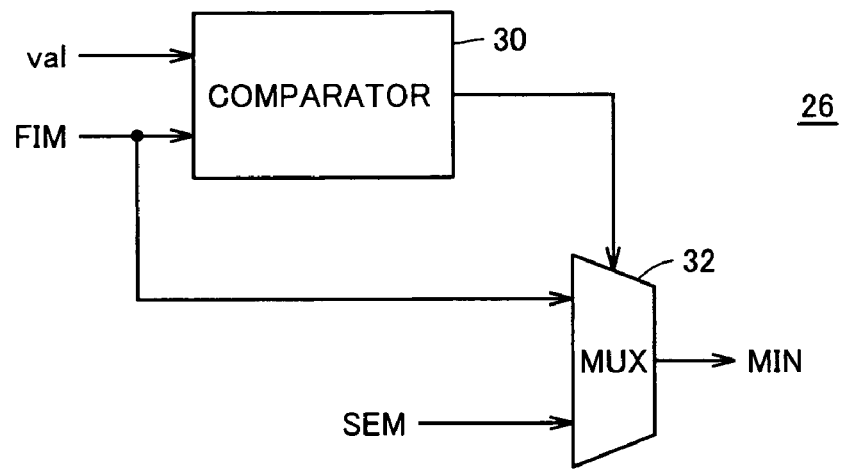
FIG. 11 schematically shows a construction of a selector shown in FIG. 10.

FIG. 11 shows an example of a construction of selector 26 shown in FIG. 10. In FIG. 11, selector 26 includes a comparator 30 for comparing an absolute value val read from absolute value storage 20 according to positional information i, with first minimum value FIM stored in first minimum value storage 22, and a multiplexer (MUX) 32 for selecting one of first and second minimum values FIM and SEM according to the output signal of comparator 30, and outputting Min operation result MIN.

When comparator 30 determines that absolute value val read from absolute value storage 20 is equal to first minimum value FIM, multiplexer 32 selects second minimum value SEM, and outputs the selected one as Min operation result MIN. When comparator 30 determines that absolute value val read from absolute value storage 20 is different from first minimum value FIM, multiplexer 32 selects first minimum value FIM, and outputs it as Min operation result MIN.

As shown in FIGS. 10 and 11, the Min operation result can be produced by merely selecting one of first and second minimum values FIM and SEM based on the result of comparison between each absolute value val and the first minimum value FIM. Therefore, the circuit scale and the operation time can be significantly reduced.

When absolute value storage 20 is formed of a FIFO (First-In First-Out) circuit such as a shift register circuit, it is not particularly necessary to provide positional information i indicating the position of the element of interest in subset A(m). Since the element in a column corresponding to "0" in a corresponding row of the check matrix is not used, the FIFO circuit can sequentially output the absolute values val in the order of input. Therefore, absolute values val can be read from absolute value storage 20 in the order of the positions without using positional information i.

If the operation value is expressed in the two's-complement notation, for the absolute value stored in absolute value storage 20, the bits except the sign bit of the operation value are stored. When the two's-complement expression is used, bits of "1" among the sign bits are counted, and the positive/negative of the product of all of the signs of the values stored in absolute value storage 20 can be determined. According to positional information i, it is determined whether the sign bit corresponding to absolute value val stored in absolute value storage 20 matches with the product of all of the signs, and accordingly, the result of multiplication of the signs of the elements used in the Min operation can be obtained.

In this case, therefore, the Min operation and the sign multiplication operation are performed in parallel to detect outer value log-ratio $\alpha mn$ quickly.

Figure 12:
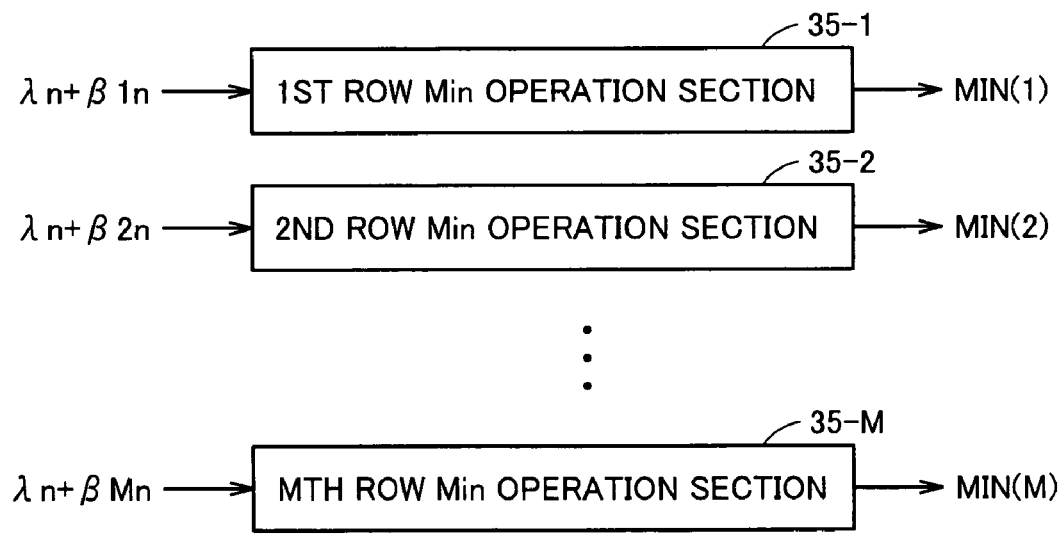
FIG. 12 schematically shows a whole construction of a Min operation section according to the first embodiment of the invention.

FIG. 12 shows a construction of the Min operation portion for a check matrix of M rows by N columns. As shown in FIG. 12, Min operation sections 35-1-35-M are provided for the first to M-th rows, respectively. First row Min operation section 35-1 receives input value ($\lambda n+\beta 1n$), and produces an Min operation result MIN(1). Second row Min operation section 35-2 receives input value ($\lambda n+\beta 2n$), and produces an Min operation result MIN(2). M-th row Min operation section 35-M receives input value ($\lambda n+\beta Mn$), and produces an Min operation result MIN(M).

These Min operation sections 35-1-35-M each have the structure shown in FIGS. 10 and 11. Each of Min operation sections 35-1-35-M receives the positional information, i.e., the information representing columns carrying "1" in the corresponding row, and performs the Min operation processing.

Accordingly, even for parity check matrix H having a large size, Min operation sections 35-1-35-M are merely provided for the respective rows, as shown in FIG. 12. Each of Min operation sections 35-1-35-M is merely required to store the first and second minimum values, and to store the values corresponding to a respective subset A(m). Therefore, the circuit scale increases only in the row direction, but increase of the circuit scale in the column direction is suppressed.

The Min operation unit is used for the decoding processing of the LDPC codes. However, even in the case where parity check matrix H is not sparse, but the parity check matrix H contains many "1s" and has a large Hamming row weight (the number of "1" in row), it is merely required to store the first and second minimum values. Therefore, by utilizing the structure of the Min operation unit, the decoding processing according to similar min-sum algorithm can be effected on different codes such as BCH (Bose-Chaudhuri-Hocquenghem) codes and CRC (Cyclic Redundancy Check) codes other than the LDPC codes.

When the Min operation processing is performed in synchronization with a clock signal, positional information i can be produced by counting the clock signal defining the processing cycle.

According to the first embodiment of the invention, as described above, the Min operation processing is performed by storing the first and second minimum values of the elements corresponding to a subset for comparison with the absolute value of each element. Therefore, even in the case where the rows of the check matrix increase in number, it is possible to suppress increase of the circuit scale, and the Min operation processing can be executed at high speed.

Second Embodiment

Figure 13:
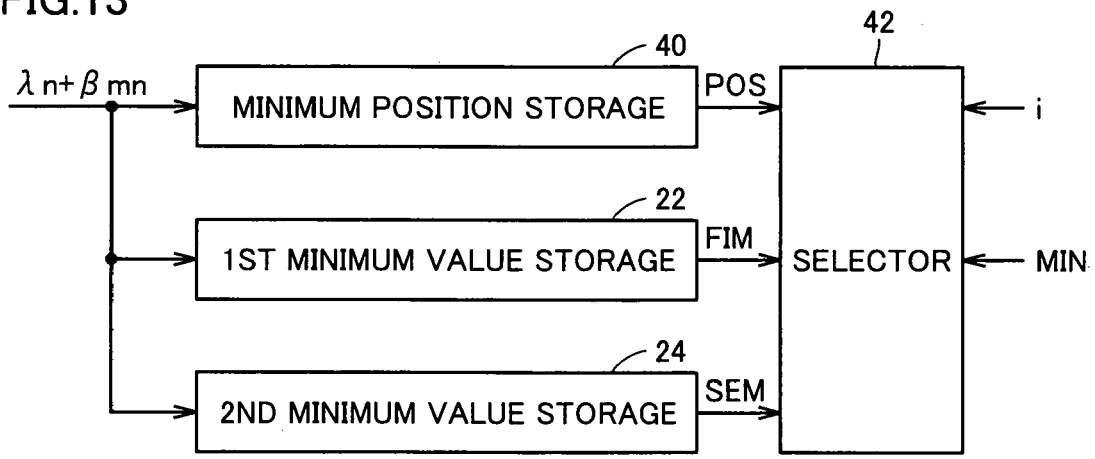
FIG. 13 schematically shows a construction of a Min operation section according to a second embodiment of the invention.

FIG. 13 schematically shows a construction of a Min operation unit according to a second embodiment of the invention. In FIG. 13, the Min operation unit includes first and second minimum value storages 22 and 24 using input values ($\lambda n+\beta mn$) and storing the first and second minimum values among the absolute values thereof, respectively, a minimum position storage 40 for storing positional information POS in the processing unit for row processing of the first minimum value stored in first minimum value storage 22, and a selector 42 for selecting one of the first and second minimum values FIM and SEM based on comparison between positional information POS of minimum position storage 40 and positional information i of the signal of interest, i.e. the signal to be operated, and outputting an Min operation result MIN.

According to the construction of the Min operation unit shown in FIG. 13, it is merely required to store the position information in the row processing unit of first minimum value FIM, and it is not required to store the value of each signal in a row processing unit, so that the device scale can be further reduced.

Figure 14:
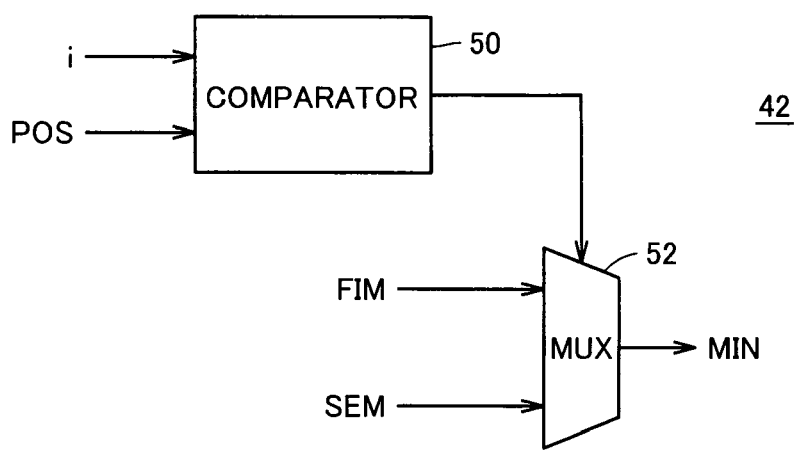
FIG. 14 schematically shows a construction of a selector shown in FIG. 13.

FIG. 14 schematically shows a construction of selector 42 shown in FIG. 13. In FIG. 14, selector 42 includes a comparator 50 for comparing positional information i representing the position of the value of the operation target with positional information POS representing the position of first minimum value FIM in signal processing unit, and a multiplexer (MUX) 52 for selecting one of the first and second minimum values FIM and SEM according to the output signal of comparator 50, and outputting the selected one as the Min operation result MIN.

When comparator 50 indicates that positional information i is equal to information POS, selector 42 selects the second minimum value SEM to output the selected value SEM as Min operation result Min. When comparator 50 indicates that positional information i is different from information POS, multiplexer 52 selects first minimum value FIM to output the same as Min operation result MIN.

In the case where the first minimum value FIM are present in a plurality of positions, it is merely required to store only one of the positions of the first minimum value.

Figure 15:
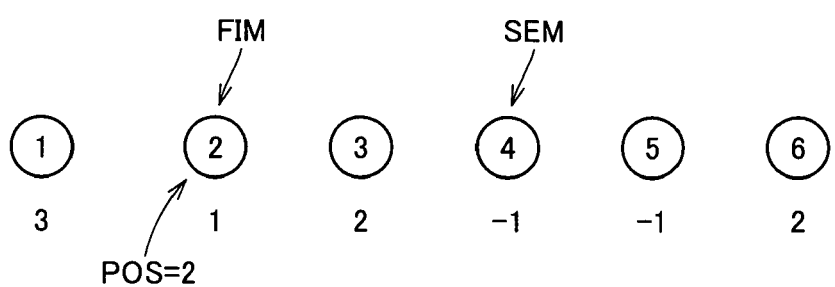
FIG. 15 represents an operation of the Min operation section shown in FIG. 13.

Specifically, it is now assumed that values of 3, 1, 2, −1, −1 and 2 are assigned to variable nodes 1 to 6 as shown in FIG. 15, respectively. The Min operation for the shown signal series is performed as follows. In calculating the minimum value of the absolute values, a value "1" of variable node 2 is first stored as first minimum value FIM, and the node number "2" thereof is stored as minimum positional information POS. Variable node 4 or 5 carries the absolute value of 1, and in this case, the value of variable node 4 is stored as second minimum value SEM. Second minimum value SEM of variable node 4 is "1" because the absolute value is taken. In this case, therefore, first and second minimum values FIM and SEM are equal to each other. When effecting the Min operation on variable node 2, the minimum value of the absolute values is selected with reference to signal values of the variable nodes other than variable node 2, and therefore, the second minimum value SEM is selected. In effecting the Min operation on variable node 4, the Min operation is performed with reference to signal values of the variable nodes other than variable node 4, so that first minimum value FIM of variable node 2 is selected. For variable node 5, first minimum value FIM of variable node 2 is likewise selected.

Even in the case where a plurality of signal values each have the absolute value equal to the first minimum value, two of such values are stored as the first and second minimum values, respectively, and the positional information on a position of only the first minimum value is stored. Accordingly, the Min operation can be accurately performed by selecting the first or second minimum value according to the position of the signal value of the operation target.

The Min operation unit shown in FIG. 13 is arranged in parallel with each row of the check matrix, similarly to the structure shown in FIG. 12, and the Min operation in the row processing for obtaining αmn is executed for each row in parallel with the Min operation on the other rows.

Figure 16:
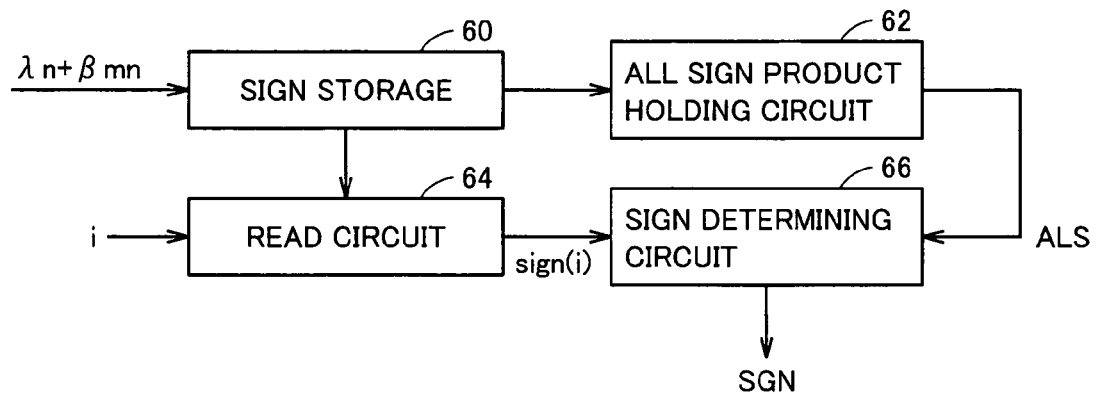
FIG. 16 schematically shows an example of a construction of a sign calculating portion of the row processing section shown in FIG. 3.

FIG. 16 schematically shows by way of example a construction of a portion in the row processing unit, for producing a sign SGN of outer value log-ratio αmn. In FIG. 16, the sign producing portion includes a sign storage 60 for sequentially storing signs of input signals (λn+βmn), an all sign product holding circuit 62 for obtaining and holding a product of all of the signs stored in sign storage 60, a read circuit 64 for reading out the sign from sign storage 60 according to positional information i, and a sign determining circuit 66 for determining the sign SGN of outer value log-ratio αmn based on the sign, sign(i), read by read circuit 64 and a sign ALS of the all-sign product held in all sign product holding circuit 62.

Sign storage 60 is formed of, e.g., an FIFO circuit, and sequentially stores the signs of input signals (λn+βmn). Sign product holding circuit 62 successively multiplies the signs stored in sign storage 60, and holds the final result of the multiplication. Read circuit 64 reads the signal sign(i) stored in sign storage 60 according to positional information i.

When the sign, sign(i), read from read circuit 64 is positive, sign determining circuit 66 outputs all sign product result ALS as the sign SGN of outer value log-ratio αmn. When the sign, sign(i), read from read circuit 64 is negative, sign determining circuit 66 inverts the sign ALS supplied from all sign product holding circuit 62 to produce sign SGN of outer value log-ratio αmn.

Thereby, sign SGN can be detected in parallel with the Min operations. This sign determining circuit 66 can be achieved, e.g., by an EXOR circuit when the sign of each symbol is represented by one bit, and the positive and negative signs are represented by sign bits "0" and "1", respectively.

According to the second embodiment of the invention, as described above, for the Min operation, the first and second minimum values in the corresponding signal series are stored, the position of the minimum value is stored, and one of the first and second minimum values is selected according to the position information, and is output as the result of the Min operation. It is not necessary to store all the input signal series, and the circuit scale can be reduced to achieve fast row processing even in the case where the check matrix has an increased size.

Third Embodiment

Figure 17:
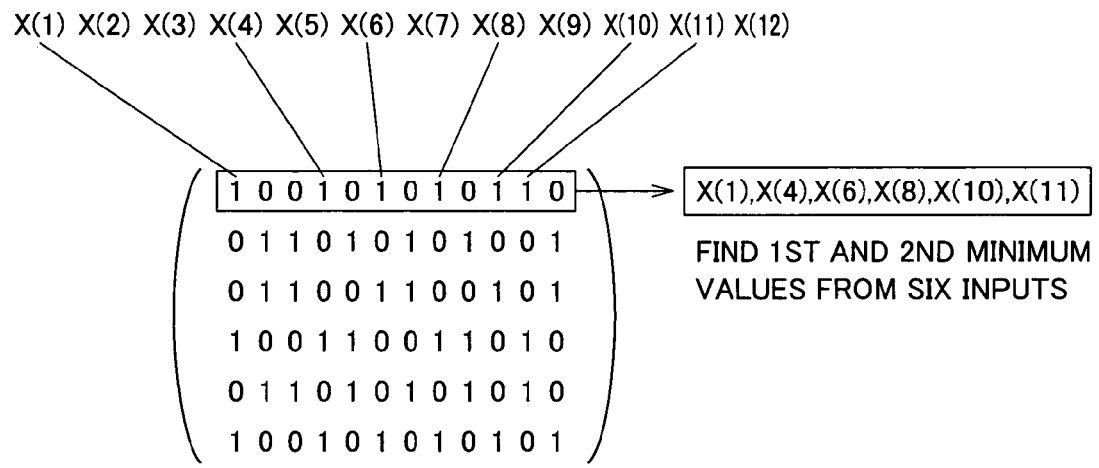
FIG. 17 shows a parity check matrix used as an example in a third embodiment of the invention.

Referring to FIG. 17, a check matrix of 6 rows by 12 columns will now be considered. The Min operation is effected on input signals X(1) to X(12). In the check matrix shown in FIG. 17, "1" is set in the first row on the 1st, 4th, 6th, 8th, 10th and 11th columns. In executing the Min operation in the processing of the 1st row, the first and second minimum values are detected from among input signals X(1), X(4), X(6), X(8), X(10) and X(11) on these columns, and are held. This detection of the minimum values can be performed in either a manner of detecting the minimum values by successively and sequentially accepting the input signals or a manner of processing the input signals in parallel, as will be described in the below in the order.

Figure 18:
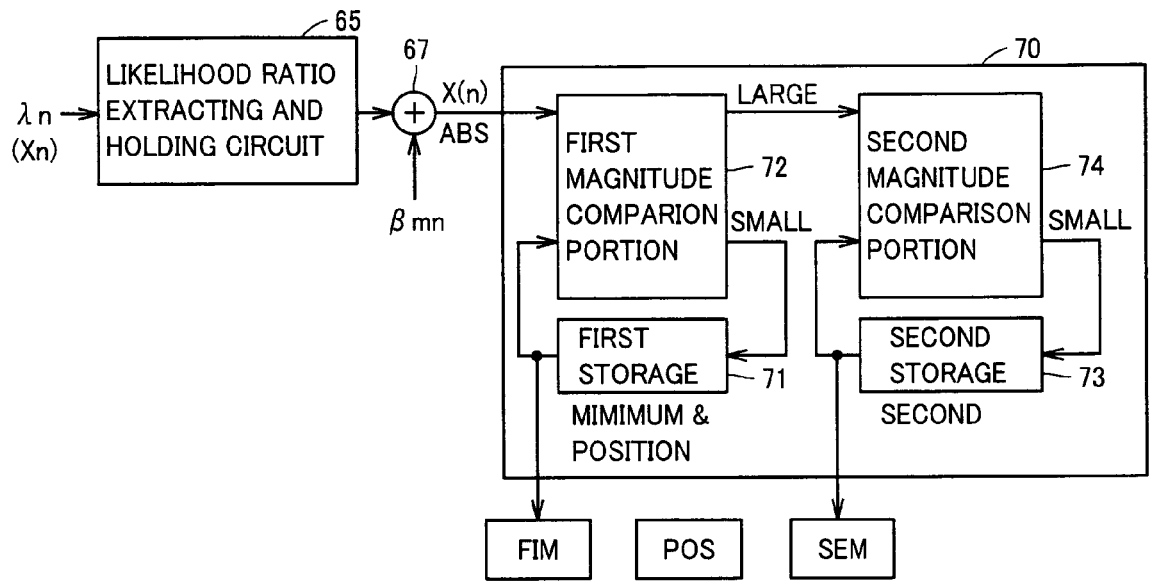
FIG. 18 schematically shows a construction of a minimum value storing section according to the third embodiment of the invention.

FIG. 18 schematically shows a construction of a Min operation section according to a third embodiment of the invention. Referring to FIG. 18, a preprocessing circuitry for the Min operation includes a likelihood ratio extracting and holding circuit 65 for extracting the likelihood ratio according to the position of "1" in the check matrix from log-likelihood ratio λn (input signal Xn), and an addition circuit 67 for performing an operation ABS of adding the likelihood ratio held by likelihood ratio extracting and holding circuit 65 to the a priori value log-ratio βmn supplied from the column processing unit, and obtaining the absolute value of the sum obtained to produce input signal X(n). These circuits 65 and 67 perform a preprocessing for the Min operation.

Likelihood ratio extracting and holding circuit 65 extracts and holds log-likelihood ratio λn (input symbol Xn) successively and sequentially applied, according to a corresponding subset A(m).

Addition circuit 67 produces absolute value |λn+βmn|, and sequentially supplies it as input signal X(n) to a Min operation section 70.

Min operation section 70 includes a first magnitude comparing portion 72 for comparing input signal X(n) with the value stored in a first storage 71, transferring the one having a larger likelihood to a subsequent stage circuit and storing the other value of a smaller likelihood in first storage 71, and a second magnitude comparing portion 74 for comparing the value received from first magnitude comparing portion 72 with a value stored in a second storage 73 and storing the value of a smaller likelihood of the two in second storage 73. First and second storages 71 and 73 have the storage data initialized to the maximum value of input signal X(n). First storage 71 stores positional information representing the position of the stored information in subset A(m).

As a result of the magnitude comparison by first magnitude comparing portion 72, first storage 71 stores the smaller value of input signal X(n) together with corresponding positional information i. When input signal X(n) is equal to the value stored in first storage 71, first magnitude comparing portion 72 transfers input signal X(n) to second magnitude comparing portion 74 in the subsequent stage. Therefore, first storage 71 stores the minimum value (i.e., the value of the smallest absolute value) in the series of the input signals X(n) together with the position information thereof Thus, first minimum value FIM and positional information POS can be extracted.

Second magnitude comparing portion 74 compares the signal value transferred from first magnitude comparing portion 72 with the stored value of second storage 73. When the signal value received from first magnitude comparing portion 72 is smaller in absolute value than the stored value of second storage 73, second magnitude comparing portion 74 updates the stored value of second storage 73 by the received value from the preceding stage comparison portion 72. Therefore, second magnitude comparing portion 74 stores the second minimum value, which is allowed to be equal in absolute value to first minimum value FIM. The stored value of second storage 73 is outputted as second minimum value SEM.

Accordingly, when input signals Xn are inputted, to be extracted and held by likelihood ratio extracting and holding circuit 65, then input signals X(n) are successively and sequentially transmitted to Min operation section 70. When transfer of all input signals X(n) is completed, the operation of detecting first minimum value FIM and positional information POS thereof as well as second minimum value SEM is completed. Positional information POS can be detected by counting the number of times of the comparing operation effected on received input signals X(n) by first magnitude comparing portion 72.

Min operation section 70 may be implemented by firmware such as a DSP (Digital Signal Processor), or may be configured to execute the comparing and detecting operations by software, or may be implemented by a dedicated hardware. For example, first and second storages 71 and 73 each may be formed of a register circuit or a latch circuit, which receives, as a strobe instruction signal (storage update instructing signal), a comparison result indicating signal produced from corresponding magnitude comparison portions 72 and 74. When the comparison result indicating signal indicates that the applied signal (input signal) is smaller in absolute value than the stored value, storage 71 and 73 take in and hold the signal values applied from corresponding magnitude comparison portions 72 and 74.

Figure 19:
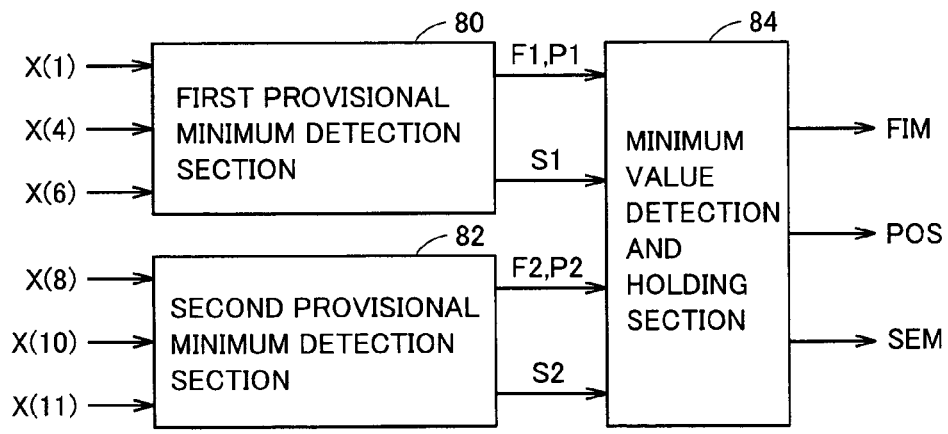
FIG. 19 schematically shows a construction of a minimum value storing section of a modification of the third embodiment of the invention.

FIG. 19 schematically shows another construction of the minimum value detecting section according to the third embodiment of the invention. In this minimum value detecting section shown in FIG. 19, input signals X(1), X(4), X(6), X(8), X(10) and X(11) to be operated in the processing unit are divided into two groups, and the first and second minimum values are provisionally detected for each group. Specifically, a first provisional minimum value detecting section 80 is supplied with input data X(1), X(4) and X(6), and detects a provisional first minimum value F1 and positional information P1 of the position thereof as well as a provisional second minimum value S1. A second provisional minimum value detecting section 82 is supplied with input data X(8), X(10) and X(11), and detects a provisional first minimum value F2 and positional information P2 of the position thereof as well as a provisional second minimum value S2. These provisional minimum values F1, S1, F2 and S2 as well as positional information P1 and P2 are applied to a minimum value detecting and holding section 84.

Minimum value detecting and holding section 84 detects first and second minimum values FIM and SEM from provisional minimum values F1, S1, F2 and S2, and holds the detected minimum values. Minimum value detecting and holding section 84 also detects and holds positional information POS of the detected first minimum value.

Minimum value detecting and holding section 84 may sequentially perform the magnitude comparison of minimum values F1, F2, S1 and S2, to detect first and second minimum values FIM and SEM based on the results of comparison. Alternatively, final first minimum value FIM and final second minimum value SEM may be detected according to the following algorithm.

(i) If S1≦F2, then F1≦S1≦F2≦S2. Therefore, F1 and S1 are set as first and second minimum values FIM and SEM, respectively.

(ii) If S2≦F1, then F2≦S2≦F1≦S1. Therefore, F2 and S2 are set as first and second minimum values FIM and SEM, respectively.

(iii) If S1>F2 and S2>F1, then F1, F2<S1, S2. Therefore, according to the relationship in magnitude between F1 and F2, the smaller one is set as the first minimum value FIM, and the larger one is set as the second minimum value SEM. In the case of F1=F2, F1 is set as first minimum value FIM, for example.

By executing the processing on the input data in parallel as shown in FIG. 19, the minimum value detecting operation can be performed at high speed.

Minimum value detecting sections 80 and 82 as well as minimum value detecting and holding section 84 may be configured to execute the detecting operations software-wise, or may also be configured to execute the detecting operations hardware-wise.

According to the third embodiment of the invention, as described above, the minimum value is detected based on the comparison of the data to be operated so that the minimum value detection can be performed accurately.

In the min-sum decoding algorithm according to the invention, the Min operation is performed by utilizing merely the first and second minimum values. Therefore, even in the case where the weight of row in a check matrix H (i.e., the number of "1" in the row of the check matrix) is large, the scale of the Min operation unit is not increased. Only the number of components in the row direction increases with the number of redundancy bits. Therefore, the object of the decoding operation is not restricted to the LDPC codes, and the decoding operation according to the present invention can be applied to other codes such as BHC codes and CRC codes by producing a parity check matrix according to a similar min-sum algorithm. Thus, the invention can be similarly applied to a check matrix other than the low density matrix for executing the decoding processing.

Accordingly, the invention can be applied to the communication system in which the LDPC codes are subject to decoding processing, and can also be applied to a decoding unit in a receiver side of a communication system utilizing other codes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A decoding unit for performing decoding in a block unit of a predetermined number of signals, comprising:
    likelihood storing means for extracting and storing a first signal of a lowest likelihood and a second signal the lowest in likelihood next to said first signal with respect to said predetermined number of signals included in one block unit;
    selecting means for selecting one of the first and second signals for each signal in said one block unit such that a signal the lowest in likelihood other than the each signal in said one block unit is selected, said selecting means including position information storing means for storing positional information on a position of said first signal stored in said likelihood storing means in a series of the signals in said one block unit, and signal selecting means for selecting one of the first and second signals according to a result of comparison between the positional information of each signal in said one block unit and the positional information stored in said position information storing means to select said signal the lowest in likelihood other than the each signal; and
    reception signal estimating means for producing a new signal from the signal selected by said selecting means and signs of the signals in said one block unit, to produce a series of estimated signals of the signals in said one block unit.

2. The decoding unit according to claim 1, wherein each signal in the one block unit has a signed value, and said likelihood storing means stores the first and second signals with an absolute value of said signed value being the likelihood.

3. The decoding unit according to claim 1, further comprising:
    means for calculating log-likelihoods of incoming signals to produce the signals in said one block unit and apply said signals produced to said likelihood storing means.

4. The decoding unit according to claim 1, wherein said likelihood storing means includes:
    first storing means,
    first comparing means for sequentially receiving the signals in said one block unit, comparing a stored value of said first storing means with a value of each received signal, storing one smaller in likelihood out of the stored value and said value of each received signal, and transferring other value larger in likelihood to a subsequent stage,
    second storing means, and
    second comparing means for comparing the value transferred from said first comparing means with a storage value of said second storing means, and storing a signal value smaller in likelihood in said second storing means out of the compared signal values.

5. The decoding unit according to claim 4, wherein:
    said position information storing means stores, as said positional information, information indicating a position, in a series of the signals in said one block unit, of the signal value stored in said first storing means.

6. The decoding unit according to claim 1, further comprising:
    extracting means for extracting a signal corresponding to a position corresponding to a position carrying "1" in a first direction of a parity check matrix from a series of the signals in said one block unit, and transferring the extracted signal to said likelihood storing means.

7. A preprocessing apparatus for performing preprocessing for processing of calculating estimated values of input signals by using elements aligned in a first direction in a parity check matrix, comprising:
    storing means for receiving signals included in one processing unit among the input signals, extracting and storing two signals of first and second signals smallest in absolute value starting at the smallest absolute value of the input signals, together with positional information of the first signal indicating a position of the first signal in said one processing unit, and
    minimum value detecting means for selecting one of the two signals stored in said storing means for each respective input signal in the processing unit such that a signal of the smallest in absolute value except said each input signal in the processing unit is selected and outputting a selected one, based on comparison between said positional information stored in said storing means and a positional information of each input signal indicating a position of said each input signal in said processing unit, the processing based on the elements aligned in the first direction of the parity check matrix on the input signals in the processing unit being performed in accordance with output signals from the minimum value detecting means.

* * * * *